(12) United States Patent  
Wendorf et al.

(10) Patent No.: US 9,888,606 B1  
(45) Date of Patent: Feb. 6, 2018

(54) AUTOMATED PANEL FOR COLD AISLE CONTAINMENT

(71) Applicant: LinkedIn Corporation, Sunnyvale, CA (US)

(72) Inventors: Eric Wendorf, Elk Grove, CA (US); Ileana M. Aquino-Otero, Portland, OR (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/383,181

(22) Filed: Dec. 19, 2016

(51) Int. Cl.  
*H05K 7/20* (2006.01)  
*H05K 7/14* (2006.01)

(52) U.S. Cl.  
CPC ....... *H05K 7/1488* (2013.01); *H05K 7/20736* (2013.01); *H05K 7/20745* (2013.01); *H05K 7/20836* (2013.01)

(58) Field of Classification Search  
CPC .......... H05K 7/20745; H05K 7/20836; H05K 7/20736; H05K 7/2079; H05K 7/20781; H05K 7/1497; H05K 7/20827; H05K 7/20772; H05K 7/20709; H05K 7/20809; H05K 7/20754; H05K 7/20145; H05K 7/1488; H05K 7/1492; H05K 7/20718; H05K 7/20; H05K 7/20727; H05K 7/20818; H05K 7/20136; H05K 7/20554; H05K 7/20572; H05K 7/20218; H05K 7/20181; H05K 7/202; G06F 1/20; G06F 1/206; H01L 23/34  
See application file for complete search history.

(56) References Cited

U.S. PATENT DOCUMENTS

| | | | | |
|---|---|---|---|---|
| 2004/0218355 A1* | 11/2004 | Bash | ................... | H05K 7/20745 361/690 |
| 2007/0146994 A1* | 6/2007 | Germagian | ........ | H05K 7/20745 361/695 |
| 2008/0291626 A1* | 11/2008 | Nelson | ................... | F24F 1/0059 361/696 |
| 2009/0107652 A1* | 4/2009 | VanGilder | .......... | H05K 7/20745 165/80.2 |
| 2009/0173017 A1* | 7/2009 | Hall | .................... | H05K 7/20745 52/69 |
| 2010/0061057 A1* | 3/2010 | Dersch | ............... | H05K 7/20745 361/690 |

(Continued)

*Primary Examiner* — Adam B Dravininkas  
(74) *Attorney, Agent, or Firm* — Park, Vaughan, Fleming & Dowler LLP

(57) ABSTRACT

Panels are extended from housings affixed to equipment racks that abut a cold aisle, during normal operation of the electronic equipment installed in the racks, in order to fully or partially contain the cold aisle (e.g., within a data center). The panels may extend automatically (e.g., during powering up of the equipment) and/or in response to a specific control. In response to an emergent condition (e.g., fire), and/or activation or deactivation of a control, the panels automatically retract. The retraction allows a fire suppression agent (e.g., water, foam) to enter the aisle, may allow easier access to the equipment, and/or provide other benefits. The panels are generally transparent in order to allow light to enter the aisle even when the panels are extended. In its extended orientation, a given panel may engage or be in contact with an opposing panel (e.g., across the cold aisle) and/or an adjacent panel.

20 Claims, 6 Drawing Sheets

(56) References Cited

U.S. PATENT DOCUMENTS

| | | | | |
|---|---|---|---|---|
| 2010/0108272 A1* | 5/2010 | Karidis | ............... | E06B 9/42 |
| | | | | 160/238 |
| 2010/0243175 A1* | 9/2010 | Gonzales | ............... | A62C 2/10 |
| | | | | 160/7 |
| 2011/0108207 A1* | 5/2011 | Mainers | ............... | H05K 7/20745 |
| | | | | 160/87 |
| 2011/0256823 A1* | 10/2011 | Ludmann | ............... | H05K 7/20745 |
| | | | | 454/184 |
| 2011/0271610 A1* | 11/2011 | Cottuli | ............... | H05K 7/20745 |
| | | | | 52/173.1 |
| 2012/0281352 A1* | 11/2012 | Namek | ............... | H05K 7/20745 |
| | | | | 361/679.46 |
| 2013/0165035 A1* | 6/2013 | Krietzman | ............... | H05K 7/20745 |
| | | | | 454/184 |
| 2015/0113883 A1* | 4/2015 | Wang | ............... | E04B 9/02 |
| | | | | 52/1 |

\* cited by examiner

AUTOMATED PANEL FOR COLD AISLE CONTAINMENT

BACKGROUND

This disclosure relates to cold aisle containment. More particularly, automated panels are provided for use as components in a cold aisle containment system.

Cold aisle containment involves physical barriers erected to contain a supply of chilled air in proximity to intake ports of information technology (IT) equipment (e.g., servers, storage devices) and/or other electronic equipment. By containing the chilled air, the air is less likely to bypass the equipment and more likely to enter the equipment and provide the desired cooling effect.

Some cold aisle containment systems require extensive modification to the data center and/or other space surrounding the location of the IT equipment. For example, such a system may involve permanently erected doors, walls, and/or roofs to surround a cold aisle, in which case light, fire suppression, uninterruptible power, and/or other services must be introduced to the system because the data center's normal services cannot penetrate the containment. In an environment in which only a limited number of cold aisles are to be contained (e.g., for one organization's IT equipment installed in a data center that serves or supports multiple organizations), the necessary modifications may not be feasible or may be cost-prohibitive.

Some other cold aisle containment systems avoid the need to modify some data center services (e.g., fire suppression) by employing panels (e.g., roof panels) that automatically detach and fall to the floor. While this feature may open the cold aisle to fire suppression, light, and/or other services, falling panels are not beneficial to the health of anyone or anything (e.g., equipment, cables) located in the cold aisle when they fall. In addition, the panels must be replaced after each use (i.e., after they are detached), thereby requiring storage of spare panels and/or causing a lack of containment after usage and until replacements are installed.

DETAILED DESCRIPTION

The following description is presented to enable any person skilled in the art to make and use the disclosed embodiments, and is provided in the context of one or more particular applications and their requirements. Various modifications to the disclosed embodiments will be readily apparent to those skilled in the art, and the general principles defined herein may be applied to other embodiments and applications without departing from the scope of those that are disclosed. Thus, the present invention or inventions are not intended to be limited to the embodiments shown, but rather are to be accorded the widest scope consistent with the disclosure.

In some embodiments, a system, method, and apparatus are provided for partially or fully containing a cold aisle within a data center or other environment. In these embodiments, a cold aisle is an area in which conditioned (e.g., cooled) air is introduced to the data center through floor vents or other means, for consumption by one or more banks of information technology (IT) equipment or other equipment that benefits from the conditioned air. For example, two opposing banks of servers, storage arrays, and/or other equipment may be situated such that the intake ports of the equipment face or abut a common aisle that has a floor perforated with vents through which cool air is forced.

In embodiments described herein, panels within housings situated atop the equipment and/or in other orientations (e.g., at an end of the cold aisle) extend from the housings to at least partially contain the aisle. The panels may be placed into and remain in their extended positions during normal operation of the environment or the equipment abutting the cold aisle, and then be retracted in response to detection of an emergent condition or other trigger. The panels may, for example, retract automatically in response to activation of an emergency power-off control (e.g., for powering off the equipment), or may operate in conjunction with a sensor that detects smoke, particulate, fire, earthquake and/or other conditions and cause the panels to retract. Illustratively, the panels may be extended as part of the normal process of powering up the equipment, or may extend in response to manual activation of one or more extension means.

Illustrative means for extending and/or retracting a panel may include a pneumatic or hydraulic piston, a jackscrew, a servo motor, one or more stiff or retractable springs, or other component that extends the panel in response to an extension trigger (e.g., applying power to equipment adjacent to the cold aisle, activation of a switch or other control) and/or retracts the panel in response to a retraction trigger (e.g., cutting off power to the equipment, deactivation of a switch or other control). Means for extending and/or retracting a panel may include or may operate in conjunction with rails, ball bearings, mechanical guides, and/or other apparatus for guiding the panel during its movement.

Figure 1:
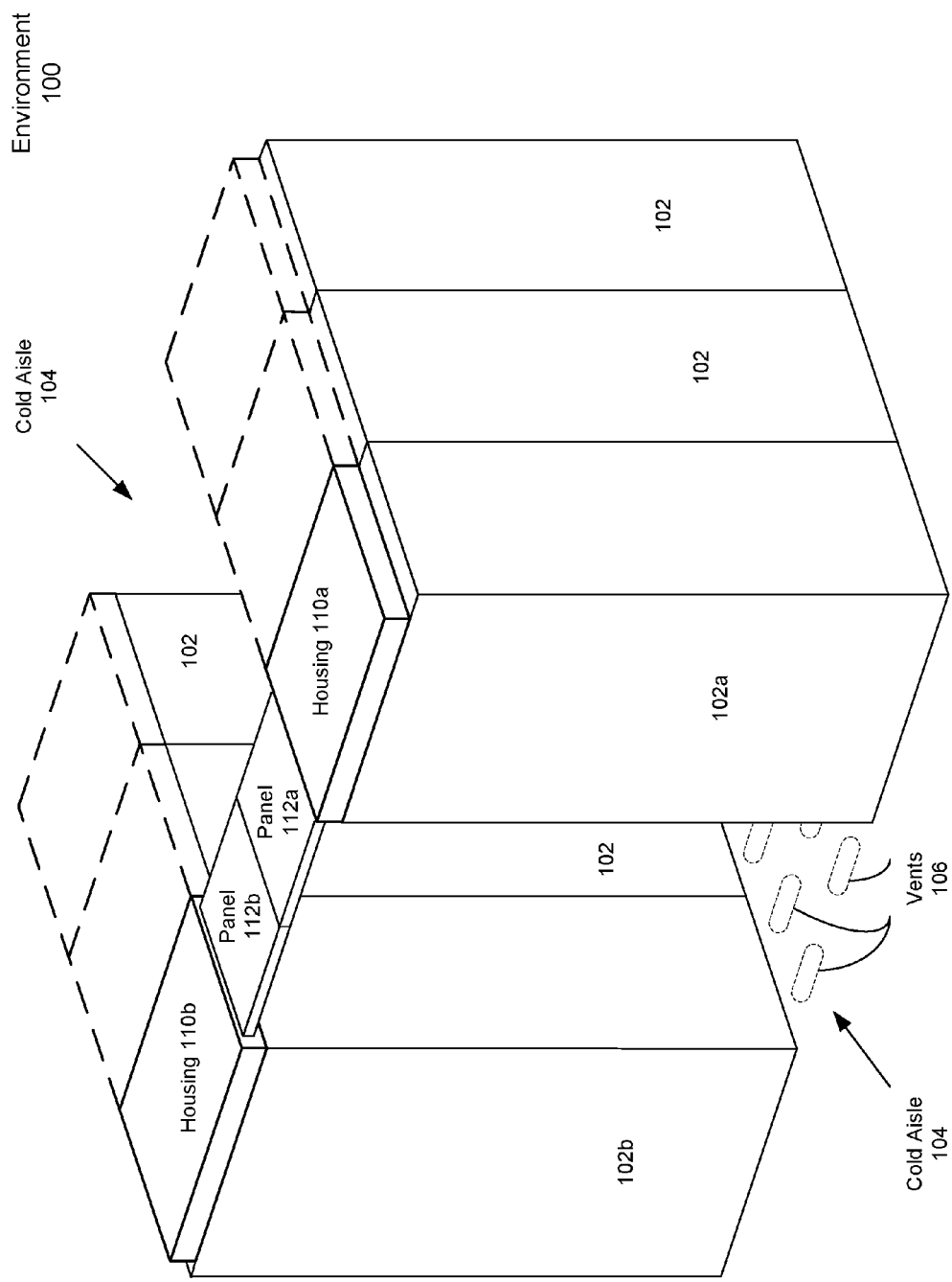
FIG. 1 is a block diagram depicting containment of a cold aisle, in accordance with some embodiments.

FIG. 1 is a block diagram depicting a system or apparatus for at least partially containing a cold aisle, according to some embodiments.

Environment 100 of FIG. 1 may be a data center, a computer room, or other space in which electronic equipment (e.g., IT equipment) operates, or a portion of such a space. In particular, racks or cabinets 102 (e.g., racks 102a, 102b) comprise computer servers, communication equipment (e.g., routers, gateways), data storage (e.g., magnetic or optical disk, solid state drives, storage arrays), and/or other equipment that generates heat during operation and therefore benefits from a supply of chilled air. A given rack 102 may be empty, may be fully populated with equipment, or may be partially populated.

Cold aisle 104 is defined by two rows of racks 102, but may alternatively be defined by a single row of racks 102 and some other object(s), such as a wall. Cool or cold air is forced into cold aisle 104 via vents, holes, or perforations 106. Due to the pressure with which the air is introduced into the cold aisle, the cool air rises and made available to air intakes of the equipment installed in racks 102, assuming their intakes face cold aisle 104 (illustratively, their exhaust ports may be located on the other side of the racks).

Housings 110 are situated or installed atop some or all racks 102. In FIG. 1, for example, housing 110a is situated atop a first rack 102a, while housing 110b is installed atop a second rack 102b that is opposite the first rack (i.e., across cold aisle 104). By installing housings atop each rack 102 and by extending the panels of every housing, an upper boundary of the cold aisle (e.g., a roof) can be created, thereby at least partially containing the aisle. In some alternative embodiments, a housing may be installed within a rack. For example, housings may be installed in a position near the top of the rack, at which position they may still be considered to be located atop the equipment and may still form a roof for the cold aisle.

In order to demonstrate the nature of the embodiments, some details are omitted from FIG. 1. For example, individual items of electronic equipment are not shown, but it will be understood that by sealing or partially sealing an upper portion of cold aisle 104, the cool air introduced to the aisle will be more likely to be consumed by the electronic equipment (by being drawn into their air intakes) instead of bypassing the equipment and escaping above the aisle, the equipment, and racks 102.

In addition, FIG. 1 does not show the devices, apparatus, or other means for extending panels 112 from housings 110, nor the devices, apparatus, or other means for retracting the panels into the housings. These aspects of the embodiments are discussed herein and depicted in other figures.

In some embodiments, means for extending panels 112 from their housings 110 serve to extend the panels to their extended positions (e.g., as shown for panels 112a, 112b in FIG. 1) and also to maintain them in their extended positions during normal operation of the equipment and/or environment 100. When an emergent condition merits the opening or unsealing of the cold aisle, or when there is some other reason to do so, the extension means may be unpowered or deactivated, and/or the retraction means are powered or activated, which will cause the panels to retract.

In some implementations, for example, an extension means comprises pneumatic pressure (e.g., from an air pump, within an electrically powered pneumatic piston) that, while powered, creates sufficient pressure to force a panel from its housing and into its extended position, either directly or by applying force to a piston or other mechanical component coupled to the panel. As long as sufficient pressure is maintained, the panel remains extended.

Illustratively, the air pump or other device for generating pneumatic pressure activates automatically when the extension means are triggered, operates as necessary (e.g., to prevent the pressure from falling below a threshold), and upon deactivation (e.g., when retraction is triggered) the air pump ceases operation and the accumulated air pressure is allowed to escape (e.g., via a relief valve that opens in response to the trigger). A pneumatic means of extension may comprise a closed-loop or an open-loop air system.

In these implementations, a retraction means may comprise a spring, spring-like, or counter-weight device that, while normally suppressed or overcome by the extension means, is able to retract the panel when the extension means is deactivated.

In some implementations, a single extension means may serve multiple housings to extend their panels (and maintain them in extended positions). For example, a single pneumatic pump may be coupled to and support all housings situated in or above multiple equipment racks or an entire bank or row of racks.

To facilitate extension and/or retraction, a panel or a portion of a housing that contacts the panel may include slides, ball-bearings, wheels, and/or other low-friction components that facilitate movement of the panel. For example, a panel may include or be coupled to slides such as those used with rack-mounted equipment that be partially slid out of a rack (e.g., for servicing).

In illustrative embodiments, a panel employed as part of an apparatus or system for at least partially containing a cold aisle is completely or partially optically transparent. Thus, in these embodiments, the cold aisle receives light from the environment's existing lighting devices without requiring installation of lighting within the aisle.

A panel may be of uniform thickness, width, and/or height, or there may be some variation. For example, one or more edges of a panel may act as a frame that is thicker and sturdier than the rest of the panel. Some or all of a panel may be constructed of polycarbonate, possibly reinforced with glass fiber.

One or more edges of a panel may be enhanced to promote better containment in conjunction with an adjacent or opposite panel. For example, one or more sides of a panel (e.g., sides that will be adjacent to other panels extended from other housings installed over the same row of racks or cabinets) may include brush-like fringes that mesh with fringes of adjacent panels. Other enhancements may be used instead of interacting or interlocking fringes, such as polystyrene or rubber strips or a pleated material that expands when the panel is extended and refolds when the pane is retracted.

The outermost or distal edge of a panel extended from a first housing, which may extend toward a panel extended from a second housing installed opposite to (e.g., across the cold aisle from) the first housing, may include the same or different type of enhancement to promote containment of the aisle. For example, the distal edges of one or both of the panels may be enhanced with magnetic, ferric metal, interlocking, and/or other components that help align the panels and/or seal the aisle.

In some embodiments, however, two layers of housing and panels may be employed to (partially) contain a cold aisle. For example, a first layer of housings may be situated as shown in FIG. 1, while a second layer of housings may be installed over the border between two adjacent housings of the first layer. As a result, when the panels are extended, those of the second layer partially block the flow of air through any gap that may exist between the panels extended from the adjacent housing. The housings and panels of the second layer may be of the same dimension as those of the first layer, or may have different dimensions (e.g., they may be narrower).

Figure 2A:
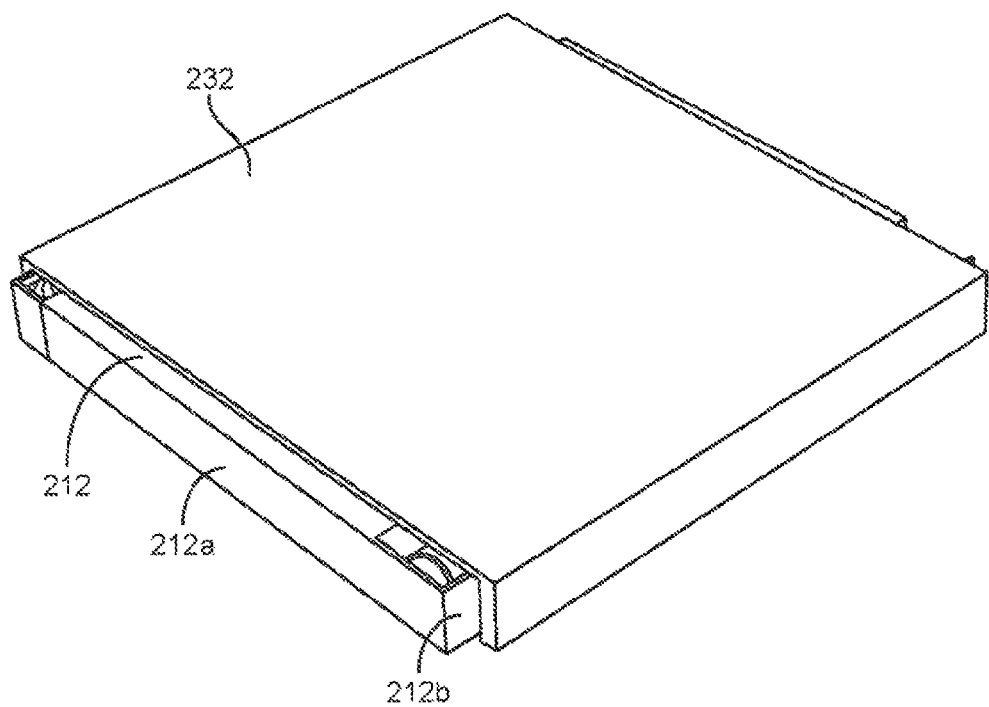
FIGS. 2A-D depict an apparatus for at least partially containing a cold aisle, in accordance with some embodiments.
Figure 2B:
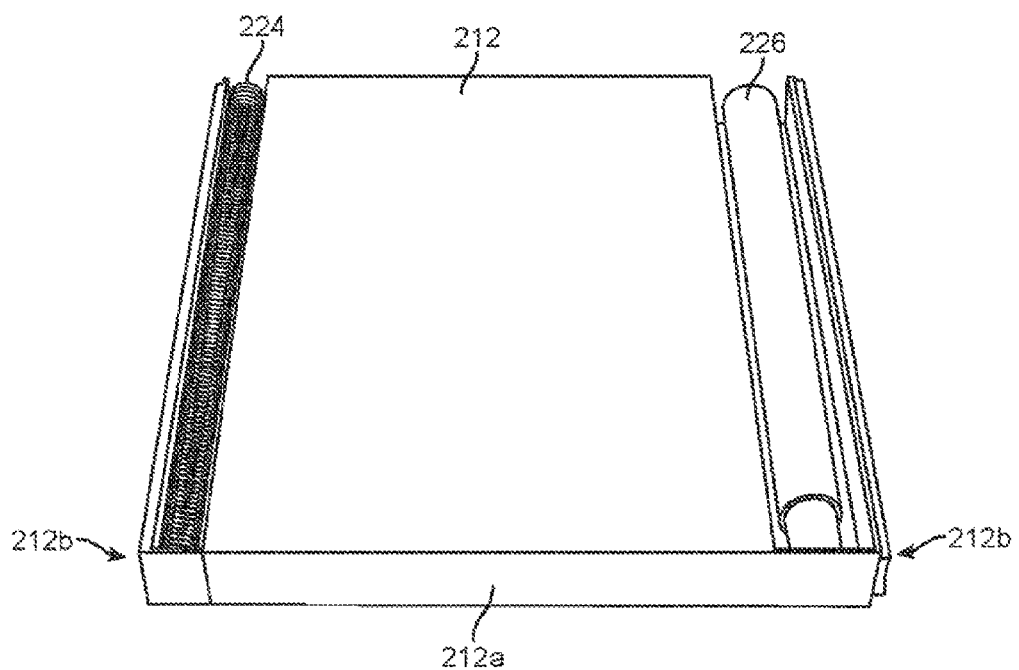
Figure 2C:
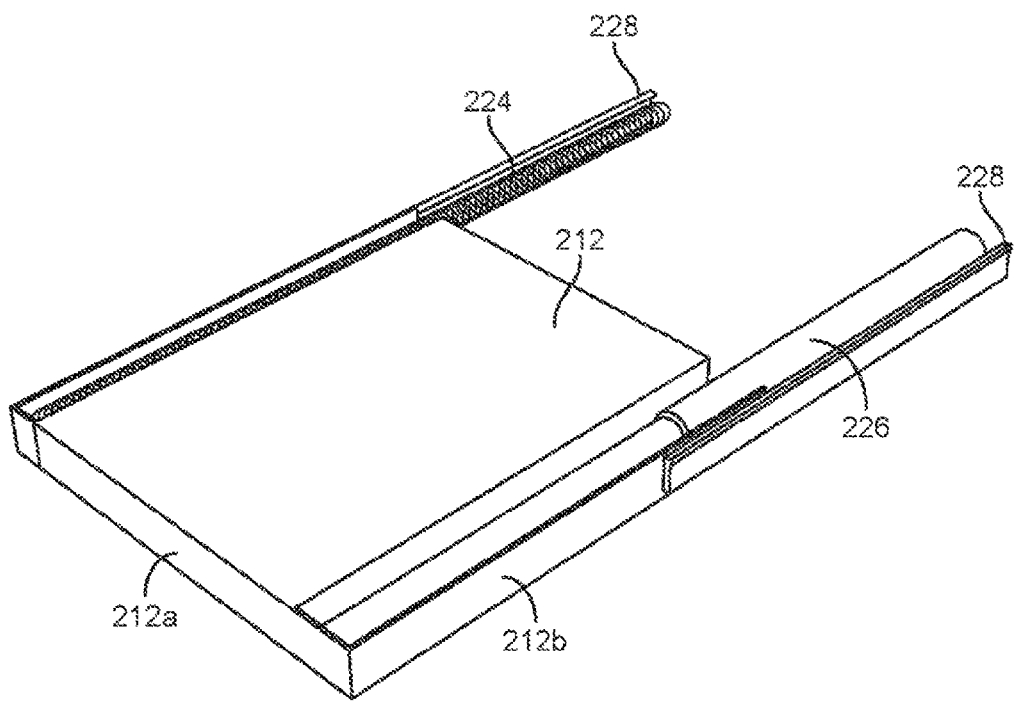
Figure 2D:
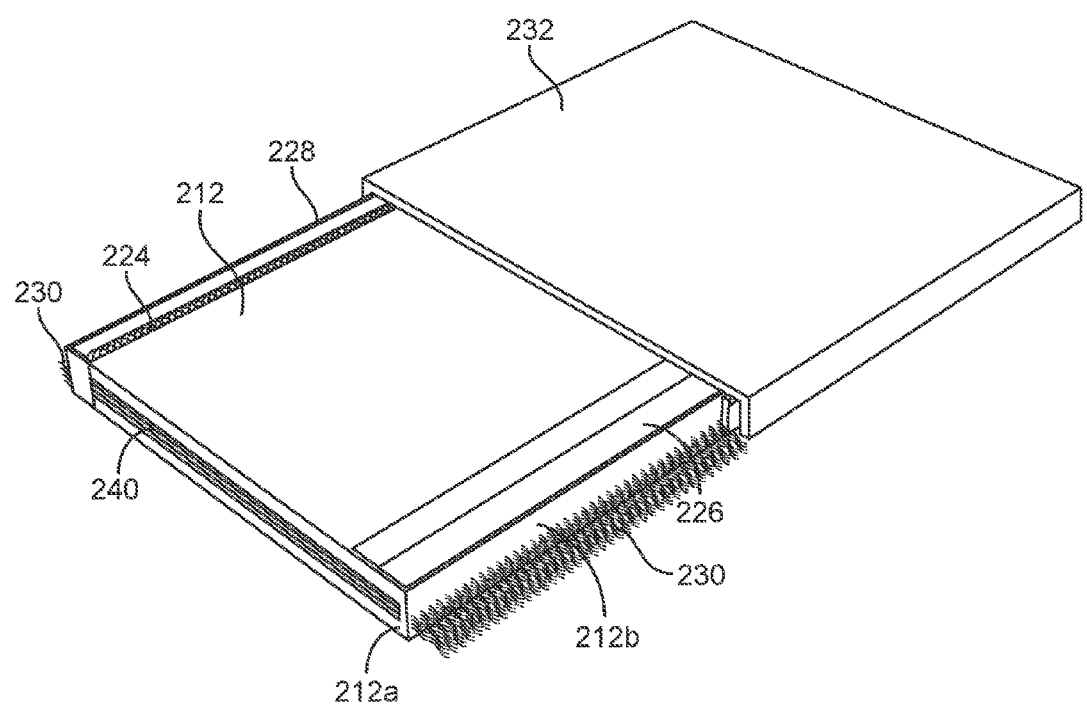

FIGS. 2A-D depict an apparatus for at least partially containing a cold aisle, according to some embodiments. FIG. 2A depicts panel 212 in a retracted posture within a housing, FIG. 2B depicts panel 212 in the retracted posture while omitting housing 232, FIG. 2C depicts the panel in an extended posture without housing 232, and FIG. 2D depicts the panel in the extended posture with the housing.

In these embodiments, extension means for extending panel 212 comprises piston 226, which may be pneumatic in some implementations and hydraulic in others, while retraction means for retracting the panel comprises spring 224. Housing 232, in which the panel resides when retracted is shown in FIGS. 2A and 2D, is omitted in FIGS. 2B-C in order to avoid obscuring details of the extension and retraction means. The housing is affixed to the top of an equipment rack, via bolts, screws, soldering, rivets, or other means. In some implementations, a panel housing may be built-into the rack when it is manufactured.

In some embodiments, piston 226 is part of a pneumatic control system that extends the piston in response to an electrical command signal. A controller for controlling piston 226 may reside inside or near the housing (e.g., on top of the housing, beside or on a side of the housing, behind the housing), and a valve (e.g., a servo valve) for extending the piston may be built into the housing or panel 212. The length of extension of the piston when triggered may be proportional to a change in the command voltage. For example, a 1 volt increase in the command signal may extend the piston 1 inch. As one alternative, the control may be discrete (i.e., on/off), so that activation of the extension trigger causes the piston to fully extend the panel regardless of the input voltage.

Panel 212 has front 212a and sides 212b that, as shown in FIG. 2C, ride rails 228 of the housing during extension and retraction. In some implementations, sides 212b include fringes 230 or other means for at least partially sealing the gap between two adjacent panels and further helping to contain the conditioned air. Panel 212 may optionally include strip 240 for at least partially sealing the gap between opposing panels (e.g., panels extended from opposite sides of the cold aisle).

Panel front 212a faces, and may abut, a cold aisle so that, when extended, the panel partially contains the cold aisle. When triggered, piston 226 extends with force sufficient to overcome the resistance of spring 224. When power to the piston is terminated, or when air pressure maintained in the piston is permitted to dissipate, the spring retracts the panel into the housing. Termination of power to the extension means may be alternatively termed activation of the retraction means, because it can now operate to retract the panel.

Although the cold aisle containment apparatus of FIGS. 2A-D incorporates a single extension means and a single retraction means, positioned on different sides of panel 212, this arrangement may differ in other embodiments. For example, piston 226 (or other extension means) may be centrally located at the rear of panel 212 (e.g., aligned with a central longitudinal axis of the panel), while springs 224 (or other retraction means) may be located on either or both sides of the panel.

Figure 3:
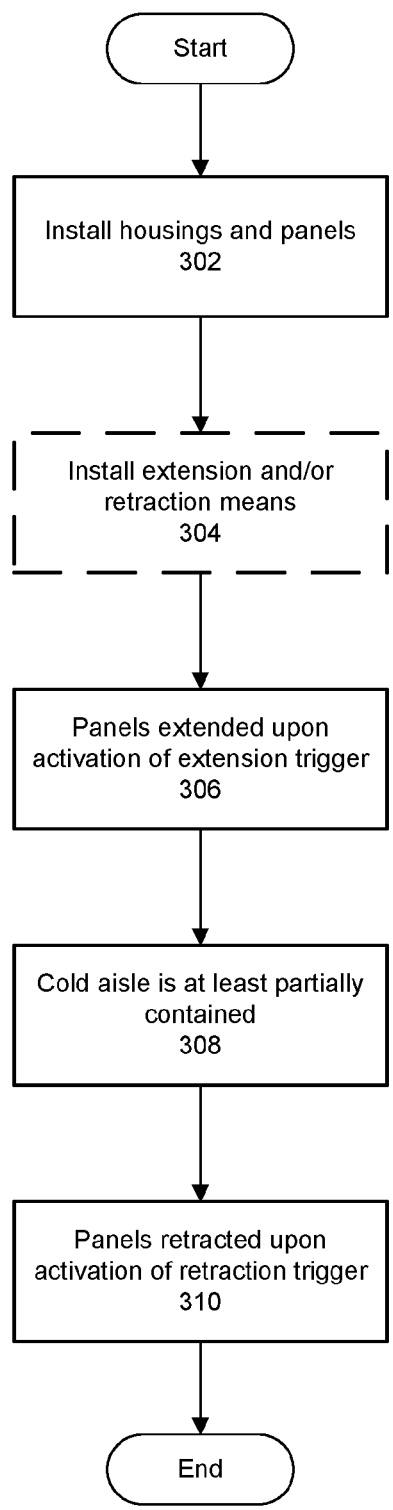
FIG. 3 is a flow chart illustrating a method for at least partially containing a cold aisle, in accordance with some embodiments.

FIG. 3 is a flow chart illustrating a method for at least partially containing a cold aisle, according to some embodiments.

The illustrated method is applied within a data center or other area of operation of electronic equipment that is cooled via chilled air. Prior to the method, the cold aisle is defined or delineated by one or two rows of equipment racks and a flow of chilled air (e.g., via raised flooring) is provided.

In operation 302, one or more housings and panels (housed within the housings) are installed. Illustratively, they may be installed atop the racks and/or at an end of the cold aisle, by affixing them to the tops or sides of the racks for example. They may be installed such that the housings are substantially parallel to the floor of the data center, or they may be inclined such that opposing panels (i.e., panels from housings that oppose each other across the cold aisle), when extended, meet (or approach one another) at an angle above (or below) a top of the racks. In particular, in an implementation in which the racks are relatively short, the housing and panels may be installed in this configuration to provide more room to an operator and/or maintenance personnel.

In operation 304, extension and/or retraction means are installed as needed. For example, if either means rely upon a device or component external to a housing (e.g., a pneumatic assembly, a spring system), those means may be installed and configured in this operation.

In operation 306, after the housings (and panels) and the extension/retraction means are installed and configured, the panels are extended when an extension trigger is activated. As discussed previously, this trigger may comprise a discrete control (e.g., a switch, a button, a software control) or may be activated as part of some other process (e.g., applying power to the racks and/or equipment abutting the cold aisle).

In operation 308, due to extension of the panels, the cold aisle is at least partially contained. As a result, more chilled air is available to the electronic equipment because its ability to bypass the equipment is reduced.

In operation 310, the panels are retracted fully or partially into their housings in response to activation of a retraction trigger. As previously described, the retraction trigger may comprise a discrete control (e.g., a switch, a button, a software control) or may be activated as part of some other process (e.g., terminating power to one or more equipment items or racks, emergency power-off within the data center).

In some embodiments, activation of the retraction trigger comprises deactivation of the extension means or extension trigger. For example, the extension means may be a pneumatic arm (e.g., a piston) that, when the extension trigger is activated, extends a panel. The retraction means may include the same pneumatic arm, and activation of the retraction means may comprise deactivation of the pneumatic arm, which causes it to retract or return to a rest state and return the panel at least partway into the housing. The retraction may be assisted with a spring or other mechanism.

Some operations affecting a panel may be controlled by software (e.g., extension, retraction, movement calibration), which may execute on computing equipment that abuts the cold aisle that the panel helps contain and/or on other computing equipment or devices.

An environment in which one or more embodiments described above are executed may incorporate a data center, a general-purpose computer or a special-purpose device such as a hand-held computer or communication device. Details of such devices (e.g., processor, memory, data storage, display) may be omitted for the sake of clarity. A component such as a processor or memory to which one or more tasks or functions are attributed may be a general component temporarily configured to perform the specified task or function, or may be a specific component manufactured to perform the task or function. The term "processor" as used herein refers to one or more electronic circuits, devices, chips, processing cores and/or other components configured to process data and/or computer program code.

Any data structures and/or program code that may be employed in embodiments described above are typically stored on a non-transitory computer-readable storage medium, which may be any device or medium that can store code and/or data for use by a computer system. Non-transitory computer-readable storage media include, but are not limited to, volatile memory; non-volatile memory; electrical, magnetic, and optical storage devices such as disk drives, magnetic tape, CDs (compact discs) and DVDs (digital versatile discs or digital video discs), solid-state drives, and/or other non-transitory computer-readable media now known or later developed.

The foregoing embodiments have been presented for purposes of illustration and description only. They are not intended to be exhaustive or to limit this disclosure to the forms disclosed. Accordingly, many modifications and variations will be apparent to practitioners skilled in the art. The scope is defined by the appended claims, not the preceding disclosure.

What is claimed is:

1. An apparatus for at least partially containing a cold aisle, the apparatus comprising:
   a panel housing facing the cold aisle, the panel housing comprising a panel;

extension means for extending the panel, from the housing, to an extended position; and retraction means for retracting the panel into the housing from the extended position;

wherein the extension means comprises a pneumatic arm that is powered during a normal operation of electronic equipment abutting the cold aisle and unpowered during other than normal operation of the electronic equipment.

2. The apparatus of claim 1, wherein:

the panel housing is affixed to a first rack of electronic equipment abutting the cold aisle opposite to a second rack of electronic equipment also abutting the cold aisle; and another panel housing affixed to the second rack of electronic equipment comprises another panel extendable to another extended position.

3. The apparatus of claim 2, wherein, in the extended positions, a combination of the panel and the other panel partially contains the cold aisle.

4. The apparatus of claim 2, wherein, in the extended positions, the panel and the other panel are in contact.

5. The apparatus of claim 2, wherein the panel further comprises:

means for engaging the other panel when the panel and the other panel are in the extended positions.

6. The apparatus of claim 1, wherein:

the panel housing is installed atop a first rack of electronic equipment abutting the cold aisle; and an additional panel housing comprising an additional panel extendable to another extended position is installed atop each of multiple additional racks of electronic equipment abutting the cold aisle on a same side of the cold aisle.

7. The apparatus of claim 6, wherein the panel further comprises:

means for engaging an adjacent additional panel when the panel and the additional panel are in the extended positions.

8. The apparatus of claim 1, wherein:

the extension means is activated by an extension trigger that is activated in association with the normal operation of the electronic equipment abutting the cold aisle; and the retraction means is activated by a retraction trigger that is activated in association with the other than normal operation of the electronic equipment.

9. The apparatus of claim 8, wherein activation of the retraction trigger comprises deactivation of the extension trigger.

10. The apparatus of claim 1, wherein the panel is substantially transparent.

11. The apparatus of claim 1, wherein the panel, in the extended position, is substantially parallel to a floor of the cold aisle.

12. A cold aisle containment system, comprising:

a first set of panel housings affixed to a first set of equipment abutting the cold aisle, wherein each panel housing comprises a first extendable panel;

first extension means for extending the first panels; and first retraction means for retracting the first panels after said extension;

wherein the first extension means comprises a pneumatic apparatus that is powered during normal operation of the equipment and that is unpowered during other than normal operation of the equipment.

13. The system of claim 12, further comprising:

a second set of panel housings affixed to a second set of equipment abutting the cold aisle opposite to the first set of equipment, wherein each panel housing in the second set of panel housing comprises a second extendable panel;

second extension means for extending the second panels; and second retraction means for retracting the second panels after said extension.

14. The system of claim 13, wherein:

extension of the first panels and the second panels causes at least partial containment of the cold aisle.

15. The system of claim 12, wherein each first panel comprises one or more of:

first means for engaging an adjacent first panel when the first panels are extended; and second means for engaging an opposite second panel when the first panels and the second panels are extended.

16. The system of claim 12, wherein:

the first extension means maintains the first panels in extended positions during the normal operation of the equipment; and the first retraction means retracts the first panel from the extended positions upon activation in response to an emergent condition.

17. The system of claim 12, wherein each first panel is substantially transparent.

18. The system of claim 12, further comprising:

a second set of panel housings installed atop a second set of equipment abutting the cold aisle opposite the first set of equipment, wherein each panel housing in the second set of panel housings comprises a second extendable panel; and second extension means for extending the second panels;

wherein the first set of panel housings is affixed atop the first set of equipment.

19. The system of claim 18, further comprising:

means for engaging each first panel with a second panel when the first panels and the second panels extend upon activation of the first extension means and the second extension means.

20. A method of at least partially containing a cold aisle, the method comprising:

affixing, to each of multiple racks of electronic equipment abutting a cold aisle, a housing comprising an extendable panel;

in association with normal operation of the electronic equipment, activating one or more extension means to extend the multiple panels from the housings, wherein:

activating the one or more extension means comprises powering pneumatic apparatus coupled to the multiple panels; and extension of the multiple panels at least partially contains the cold aisle; and in association with other-than normal operation of the electronic equipment, automatically activating retraction means to return the panels at least partway into the housings, wherein activation of the retraction means comprises unpowering the one or more extension means.

\* \* \* \* \*